United States Patent
Jaywant

(10) Patent No.: US 10,199,266 B2
(45) Date of Patent: Feb. 5, 2019

(54) INTEGRATED CIRCUIT INTERCONNECT STRUCTURE HAVING METAL OXIDE ADHESIVE LAYER

(71) Applicant: Intel Corporation, Santa Clara, CA (US)

(72) Inventor: Shruti Rajeev Jaywant, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/390,633

(22) Filed: Dec. 26, 2016

(65) Prior Publication Data
US 2018/0182709 A1   Jun. 28, 2018

(51) Int. Cl.
| | |
|---|---|
| H01L 23/52 | (2006.01) |
| H01L 21/768 | (2006.01) |
| H01L 23/532 | (2006.01) |
| H01L 23/498 | (2006.01) |

(52) U.S. Cl.
CPC .. H01L 21/76843 (2013.01); H01L 21/76814 (2013.01); H01L 21/76879 (2013.01); H01L 21/76883 (2013.01); H01L 23/49894 (2013.01); H01L 23/5329 (2013.01)

(58) Field of Classification Search
CPC ............... H01L 23/528; H01L 23/5226; H01L 21/76879; H01L 21/76804; H01L 21/7684; H01L 21/76883; H01L 23/53238; H01L 23/5329
USPC ...................................................... 257/774
See application file for complete search history.

(56) References Cited

U.S. PATENT DOCUMENTS

| | | | |
|---|---|---|---|
| 5,760,480 A | 6/1998 | You et al. | |
| 6,139,971 A | 10/2000 | Bruchhaus et al. | |
| 6,143,401 A * | 11/2000 | Fischer | H01L 21/4857 174/255 |
| 6,820,332 B2 * | 11/2004 | Japp | H05K 1/056 174/255 |
| 6,921,712 B2 * | 7/2005 | Soininen | H01L 21/02068 257/E21.171 |
| 7,727,882 B1 * | 6/2010 | Wu | H01L 21/2855 257/E21.584 |
| 8,508,018 B2 | 8/2013 | Akolkar et al. | |

(Continued)

FOREIGN PATENT DOCUMENTS

JP      2011155271 A      8/2011

OTHER PUBLICATIONS

Liu, Zhiming, et al., "A Metal Oxide Adhesion Layer Prepared with Water Based Coating Solution for Wet Cu Metallization of Glass Interposer," International Symposium on Microelectronics: Fall 2015 (Oct. 2015), vol. 2015, No. 1, pp. 000365-000369. https://doi.org/10.4071/isom-2015-WP21.

*Primary Examiner* — Luan C Thai
(74) *Attorney, Agent, or Firm* — Patent Capital Group

(57) ABSTRACT

Integrated circuit interconnect structures having a metal oxide adhesive layer between conductive interconnects and dielectric material, as well as related apparatuses and methods are disclosed herein. For example, in some embodiments, an integrated circuit interconnect structure may include a dielectric layer having 60% or more filler, a conductive layer, and a metal oxide adhesive layer between the dielectric and conductive layers. In some embodiments, the metal oxide adhesive layer may include one or more of aluminum oxide, chromium oxide, and nickel oxide.

20 Claims, 7 Drawing Sheets

(56) References Cited

U.S. PATENT DOCUMENTS

| | | |
|---|---|---|
| 9,420,697 B2 * | 8/2016 | Iwata .................... H05K 3/027 |
| 2003/0042046 A1 | 3/2003 | Japp et al. |
| 2004/0241979 A1 | 12/2004 | Faust et al. |
| 2007/0264816 A1 | 11/2007 | Lavoie et al. |
| 2014/0299999 A1 | 10/2014 | Hu et al. |
| 2015/0080302 A1 | 3/2015 | Baussant et al. |
| 2015/0364425 A1 | 12/2015 | Lee et al. |
| 2017/0033009 A1 * | 2/2017 | Scanlan ................. H01L 24/20 |

* cited by examiner

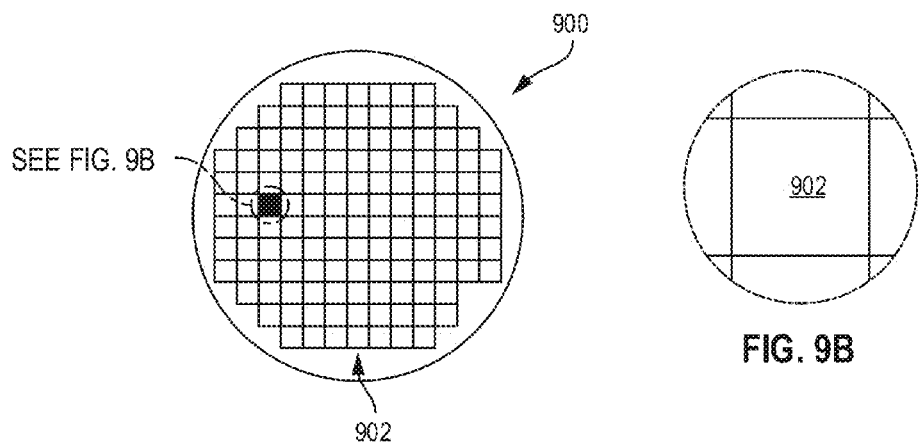
FIG. 9A
FIG. 9B
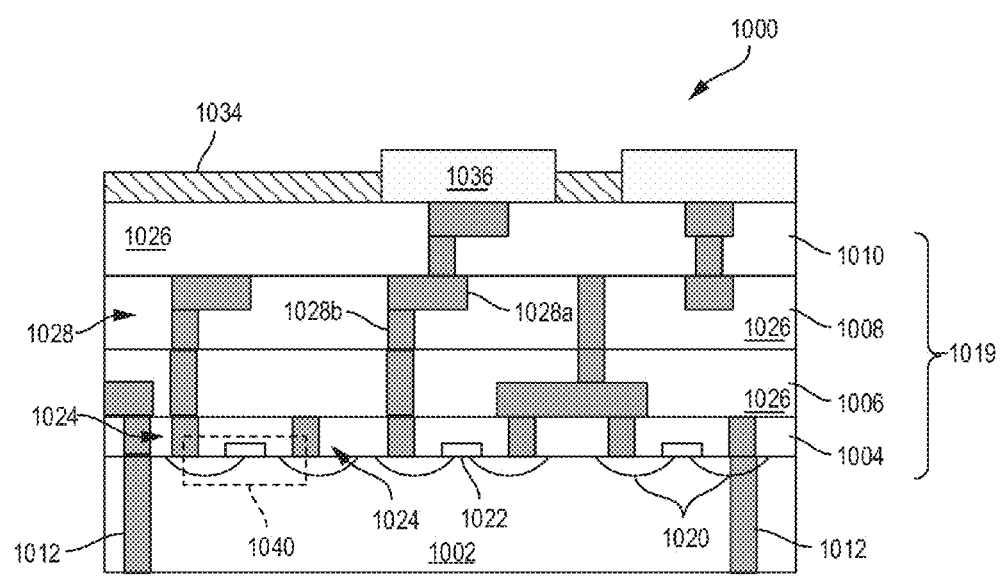
FIG. 10

INTEGRATED CIRCUIT INTERCONNECT STRUCTURE HAVING METAL OXIDE ADHESIVE LAYER

TECHNICAL FIELD

This disclosure relates generally to the field of integrated circuits and semiconductor manufacturing, and more specifically, to an integrated circuit interconnect structure having a metal oxide-containing adhesive layer for improved bonding of a metal layer to a dielectric layer where the dielectric material is highly filled.

BACKGROUND

The smaller scaling of features in integrated circuits (ICs) has been a driving force behind an ever-growing semiconductor industry. The scaling to smaller and smaller features enables increased densities of functional units on the limited real estate of semiconductor IC chips. IC chips are used in a variety of devices including computers, mobile phones, and consumer electronics. A plurality of IC chips can typically be formed on a single silicon wafer, i.e. a silicon disk having a diameter of, for example, 300 millimeters (mm), which is then diced apart to create individual chips or dies. IC chips can include feature sizes on the nanometer scale and can comprise hundreds of millions of components.

As integrated circuit features are scaled down and density increases, reliability of integrated circuits may be affected by a number of stresses that increase as feature size drops and density increases. These stresses include electrical, thermal, environmental, and mechanical stresses. Materials may be modified to address these stresses. For example, dielectric materials with low co-efficient of thermal expansion (CTE) and low dielectric loss may improve IC performance and reliability. However, as materials are modified, material performance may be affected in other aspects, such as when modified to improve thermal or electrical properties while worsening mechanical properties. In particular, there is a need for fabricating structures with dielectric materials having good dielectric properties (such as e.g. low electrical leakage, suitable value of a dielectric constant, and thermal stability) while maintaining adequate adhesion to conductive material layers.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 9A and 9B are top views of a wafer and dies that may be used with any of the embodiments of the packages disclosed herein.

FIG. 10 is a cross-sectional side view of an IC device that may be included in a die of an IC package having any of the embodiments of the packages disclosed herein.

DETAILED DESCRIPTION

Figure 1:
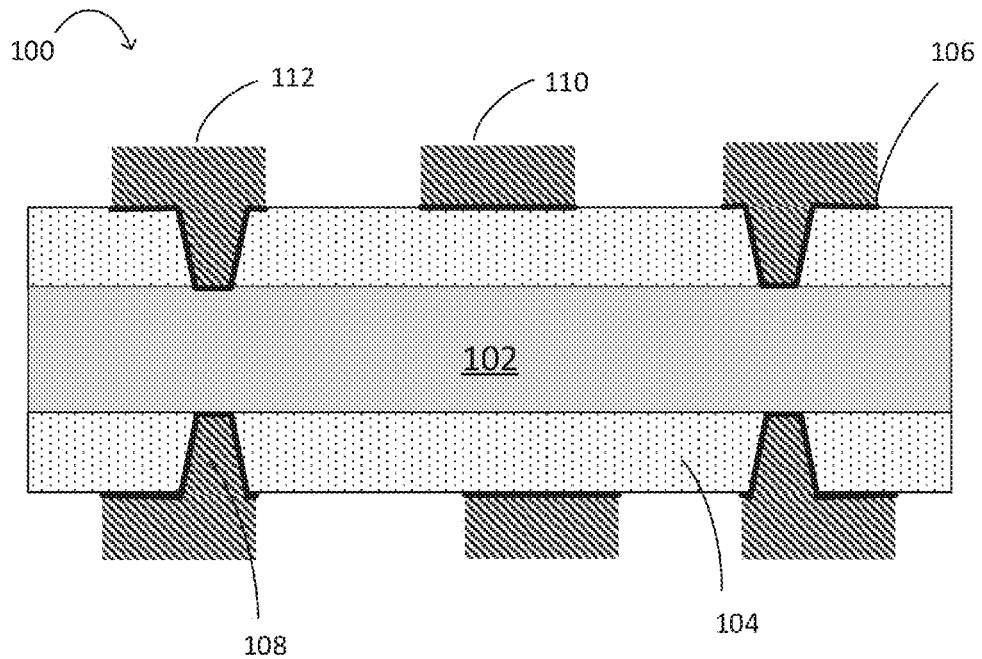
FIG. 1 illustrates a portion of an electrical interconnect structure having a metal oxide adhesive layer, in accordance with various embodiments.

Described herein are integrated circuit interconnect structures having a metal oxide adhesive layer between conductive interconnects and dielectric material, as well as related apparatuses and methods. More specifically, described herein are metal oxide adhesives for improved bonding between a metal and a dielectric material containing 60% or higher amounts of filler material. For example, in some embodiments, an integrated circuit interconnect structure may include a dielectric layer having 60% or more filler, a conductive layer, and a metal oxide adhesive layer between the dielectric and conductive layers. In some embodiments, the metal oxide adhesive layer may include one or more of aluminum oxide, chromium oxide, and nickel oxide.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation. Operations described may be performed in a different order from the described embodiment. Various additional operations may be performed, and/or described operations may be omitted in additional embodiments. Common elements in different figures may be identified with a common label.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

As integrated circuit features become smaller and thinner, component stresses that lead to circuit failure, such as delamination and electromigration, may occur more readily. Delamination is understood as the separation of layers. Electromigration is understood as the transport of material due to movement of ions in a conductor. Both delamination and electromigration are examples of phenomena that reduce semiconductor reliability, lead to interconnection failure, and become relatively more prominent as feature size decreases, particularly below 50 nanometers (nm), and as power density increases. Electromigration may occur through surface, interface, grain-boundary and lattice diffusion, with strongest contributions from interface and surface diffusion. Electromigration may result in the formation of hillocks or voids within the vias and interconnects, and eventually lead to its failure.

Various approaches have been implemented in order to reduce electromigration and other stress induced failures. Current technologies attempt to fix interconnect electromigration by adding or thickening barrier layers, by adding filler material to insulating layers, which also may reduce the CTE of the material, or by adding selective metal depositions such as electro-less copper. While adding fillers to dielectric material may reduce electromigration, adhesion between the dielectric layer and conductive layer also may be reduced and delamination may be more likely to occur. Methods for improved adhesion between a dielectric layer and a metal layer in a semiconductor device, as well as materials and devices, are provided.

Electronic connections between the electronic devices (e.g., transistors) in an integrated circuit (IC) chip are created using conductive material, typically, copper metal or alloys of copper metal. Devices in an IC chip may be placed side-by-side on the surface of the IC chip or may be stacked in a plurality of layers on the IC chip. Electrical interconnections between electronic devices on the IC chip are built using vias and trenches that are filled with conductive material. Layer(s) of insulating materials, frequently, dielectric materials with low co-efficient of thermal expansion (CTE), low dielectric loss (Df), and/or low dielectric constant (low-k), separate the various components and devices in the IC chip.

As is known in the art, the term "interconnect" (also sometimes referred to as a trench, a line, or a trace) is used to describe an electrically conductive line isolated by a layer typically comprising an interlayer low-k and/or low Df dielectric material that is provided within the plane of an IC chip. Such interconnects are typically stacked into several levels with a layer of dielectric in between the metal layers. As is also known in the art, the term "via" is used to describe an electrically conductive element that electrically interconnects two or more metal trenches of different levels. Vias are provided substantially perpendicularly to the plane of an IC chip. A via may interconnect two metal trenches in adjacent levels or two metal trenches in levels that are not adjacent to one another. As is known in the art, the terms lines, trenches, and vias are commonly associated with the features that are used to form metal interconnects. As used herein, the terms "line", "interconnect", and "trench" may be used interchangeably.

To form electrical interconnects, dielectric layers may be patterned to create one or more trench or via openings that may be filled with metal to form interconnects. In general, a feature used to form a metal interconnect is a depression having any shape formed in a substrate or layer deposited on the substrate. The feature is filled with conducting material. The trenches or vias may be created using conventional wet or dry etch semiconductor processing techniques. Dielectric materials may be used to isolate electrically metal interconnects from the surrounding components.

In various embodiments, the conductive interconnects described herein may be used to connect various components associated with an integrated circuit. Components include, for example, transistors, diodes, power sources, resistors, capacitors, inductors, sensors, transceivers, receivers, antennas, etc. Components associated with an integrated circuit may include those that are mounted on an integrated circuit or those connected to an integrated circuit. The integrated circuit may be either analog or digital and may be used in a number of applications, such as microprocessors, optoelectronics, logic blocks, audio amplifiers, etc., depending on the components associated with the integrated circuit. The integrated circuit may be employed as part of a chipset for executing one or more related functions in a computer.

Implementations of the interconnect structures disclosed herein may be formed or carried out on a substrate, such as a semiconductor substrate or core. In some embodiments, the semiconductor substrate may be a crystalline substrate formed using a bulk silicon or a silicon-on-insulator substructure. In some embodiments, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In some embodiments, the dielectric and conductive layers may be formed on a temporary carrier in a coreless process. Although a few examples of materials from which the substrate may be formed are described here, any material that may serve as a foundation upon which a semiconductor device or semiconductor subcomponent, such as a package substrate, may be built falls within the spirit and scope of the present disclosure.

The one or more dielectric layers may be formed on the substrate using dielectric materials known for their applicability in integrated circuit structures, such as low-k and/or low Df dielectric materials. The dielectric layer may be deposited by any suitable process, including, for example, chemical vapor deposition (CVD), film lamination, atomic layer deposition (ALD), or spin on process, among others. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass (OSG). Typically, low-k films have a dielectric constant smaller than that of SiO2, which has a dielectric constant of about 4.0. Low-k films having dielectric constants of about 2.7 to about 3 are typical in current semiconductor fabrication processes. Typically, low Df films have a Df value of less than 0.004. The dielectric layers may include pores or air gaps to further reduce their dielectric constant.

In some embodiments, dielectric materials may include epoxies, resins, and/or other fillers, such as silica treated with a silane coupling agent, which may be formulated to reduce the dielectric constant. As the filler material percentage increases, the mechanical adhesive properties of the dielectric material may be decreased. For example, in dielectric materials having resin and filler, among other materials, as amounts of filler material increase less resin material is exposed on the surface and lower surface adhesion occurs. Metal oxide layers placed between a dielectric material, silicon, and or other materials and the copper interconnect may promote adhesion of the copper to the other material(s). In some embodiments where dielectric materials having 60% or greater filler content, decreased adhesion to the metal layer may be improved by a metal oxide adhesive layer between the metal and dielectric layers.

Embodiments described herein provide metal oxide layers of materials that act as adhesion promoters between metal structures and dielectric materials containing a high percentage of fillers. More specifically, embodiments described herein provide metal oxide layers of materials that may act as adhesion promoters between electroless copper and dielectric materials containing a high percentage of silica filler. As used herein, dielectric materials containing a high percentage of filler are dielectric materials that are about 60% or more filler. Preferably, dielectric materials have between 65% to 75% filler. Without being limiting, it may be understood that the metal oxide adhesive may form bonds with the fillers (e.g., silica) in the dielectric material, and, also, may form bonds with the metal (e.g., electroless copper). As used herein, the terms "metal oxide adhesive" or "metal oxide adhesive layer" may be used interchangeably, and may refer to an adhesive that includes a metal oxide as well other materials and/or compounds or may refer to an adhesive that is purely a metal oxide material.

A conductive layer may be one or more layers. A multi-layered conductive layer may include a thicker metal layer deposited on a thinner seed layer of metal. For example, an electroless metal seed layer and an electrolytic metal layer deposited on top of the seed layer. The metal layers may be the same metal, such as copper, or may be different metals, such as copper and nickel. A standard electroless copper seed layer is typically about 1 micron (um) thick, and requires dielectric roughening for mechanical adhesion. Surface roughness provides a mechanical anchor for overlying photoresist and/or conductive layers, but, as such, has a high etch bias. A standard sputter seed layer may be thinner, but uses an adhesion layer, such as a titanium thin film, to maintain good adhesion. However, titanium is costly and difficult to remove, and titanium etching solutions are volatile and have a short bath-life. A metal oxide adhesion layer provides a cost-effective solution that provides good surface bonding to the dielectric layer and metal layer, and that is selectively and readily removed by etching.

FIG. 1 illustrates a portion of an electrical interconnect structure having a metal oxide adhesive layer. As shown in FIG. 1, dielectric layer 104 is deposited on top and bottom sides of substrate 102 to form two separate structures. Adhesive layer 106 lines the bottom and sides of conductive vias 108 and pads 112, and the bottom of conductive lines 110. Adhesive layer 106 includes a metal oxide and provides adhesion or bonding between dielectric layer 104 and the conductive vias 108, pads 112, and lines 110 in this embodiment. Vias 108 are a depression in dielectric layer 104 that may be formed using any suitable process, including laser drilling. Lines 110 and pads 112 may be formed using any suitable process, including patterning with photoresist material and plating with conductive material. The photoresist may be removed and any exposed metal plating and underlying adhesive may be etched.

Figure 2:
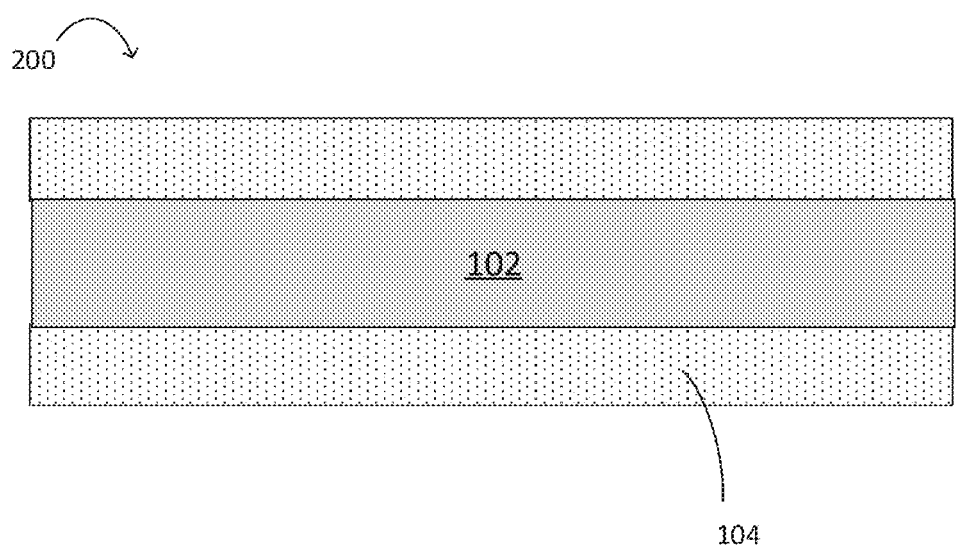
FIGS. 2-7 are cross-sectional views of an example process in various stages of forming a package substrate having a metal oxide adhesive layer, in accordance with various embodiments.

FIGS. 2-7 are cross-sectional views of an example process in various stages of forming a package substrate having a metal oxide adhesive layer, in accordance with various embodiments. FIG. 2 illustrates dielectric layer 104 deposited on substrate 102 to create assembly 200.

Substrate 102 may be made of any suitable material, such as stainless steel, glass, silicon, fiber-glass reinforced epoxy, among others. Substrate 102 may be temporary and may include a release layer, or may be a core that is permanently with the substrate. For example, substrate 102 may be a copper clad laminate core where a dielectric layer is hard pressed on the copper and thermally cured.

Dielectric layer 104 may be formed using any suitable process, such as lamination or slit coating and curing, and with any suitable material, such as epoxy with filler or epoxy resin with filler. Preferably, dielectric material includes silica or glass filler treated with silane coupling agents. In some embodiments, dielectric layers are formed to a thickness that will completely cover a top surface of the one or more vias to account for uneven surfaces. In some embodiments, the thickness of dielectric layers may be minimized to reduce the etching time required to expose the one or more vias in a subsequent processing operation. In various embodiments, the dielectric layer may include various epoxies, resins, and filler material that includes glass or silica, among other fillers. In various embodiments, the dielectric material may be about 60% to 90% filler. Preferably, the dielectric material is about 65% to 75% filler. Preferably, the filler material comprises silica.

Figure 3:
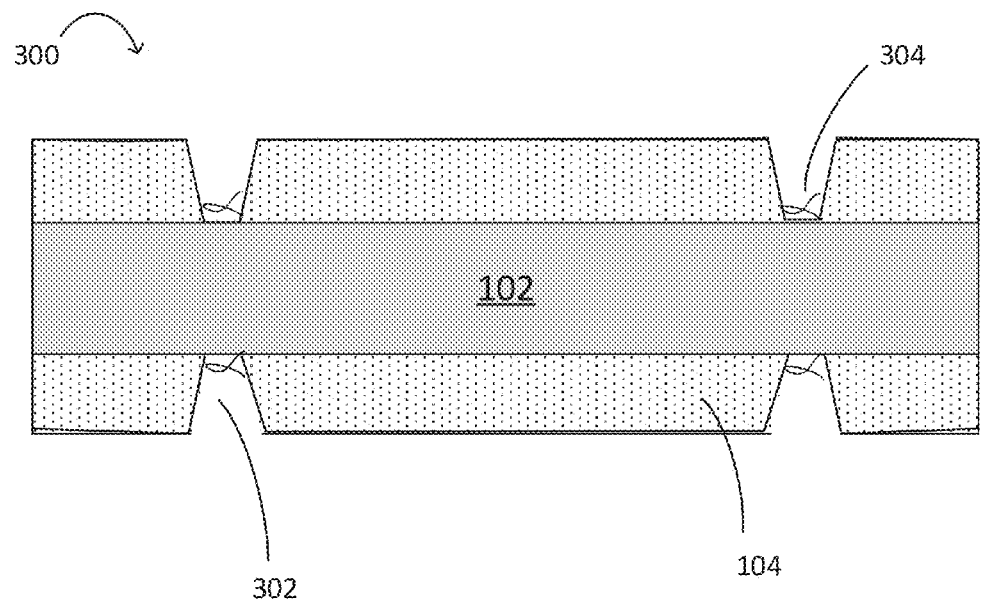

FIG. 3 illustrates assembly 300, which is assembly 300 after drilling via openings 302 in dielectric layer 104. Via openings 302 may be created, for example, by laser drilling dielectric layer 104, which may leave behind dielectric residue 304. In some embodiments, via openings 302 may have substantially vertical sidewalls. In some embodiments, via openings 302 may have angled sidewalls to form conical-shaped vias.

Figure 4:
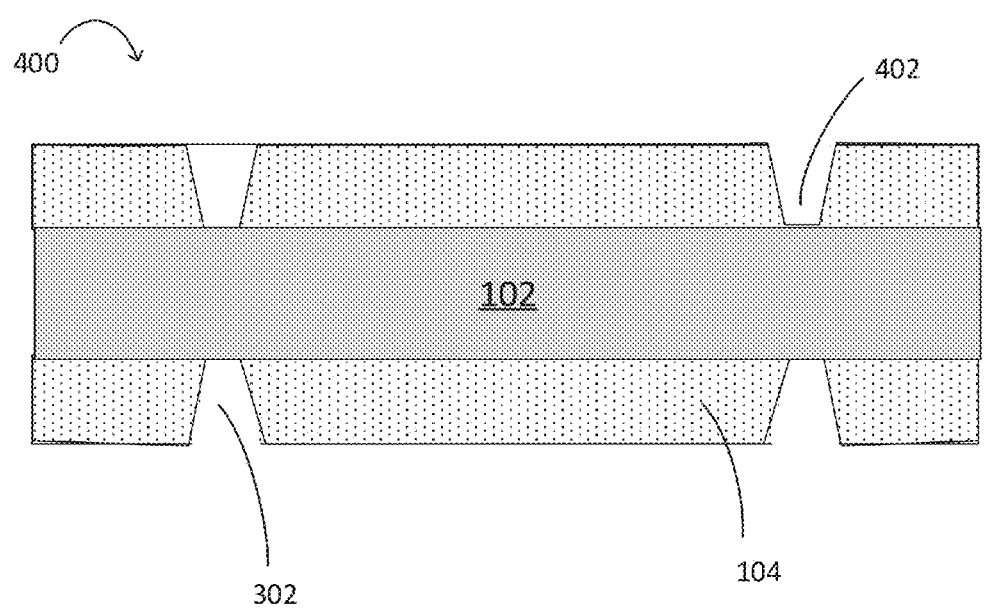

FIG. 4 illustrates assembly 400, which is assembly 300 after cleaning away residue 304 in via openings 302. Via openings may be cleaned 402 using any suitable process, for example, a wet desmear process.

Figure 5:
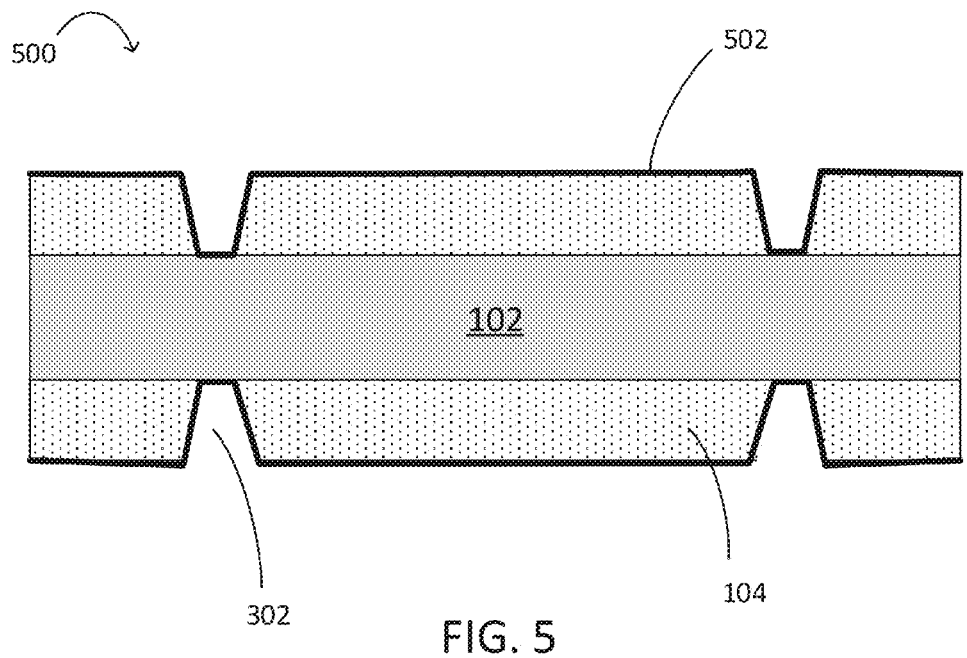

FIG. 5 illustrates assembly 500, which is assembly 400 after depositing a metal oxide adhesive layer 502 on dielectric layer 104 and via openings 302. Adhesive layer 106 includes a metal oxide, such as, for example, aluminum oxide, chromium oxide, and nickel oxide, or a combination of these materials, among others. The metal oxide may be any suitable material that provides reliable performance of the integrated circuit. The adhesive layer may have an average thickness of between 4 nm and 40 nm. Metal oxide adhesive layer may be deposited using any suitable process, including wet coating, dry sputtering, CVD, physical vapor deposition (PVD), and ALD. Preferably, the adhesive layer is deposited by a sol gel based metal oxide dip coating. Annealing, such as, thermal, UV, or laser, may be performed at a temperature of 200 degrees Celsius or less. Annealing removes solvents to form a more densely packed metal oxide layer.

Figure 6:
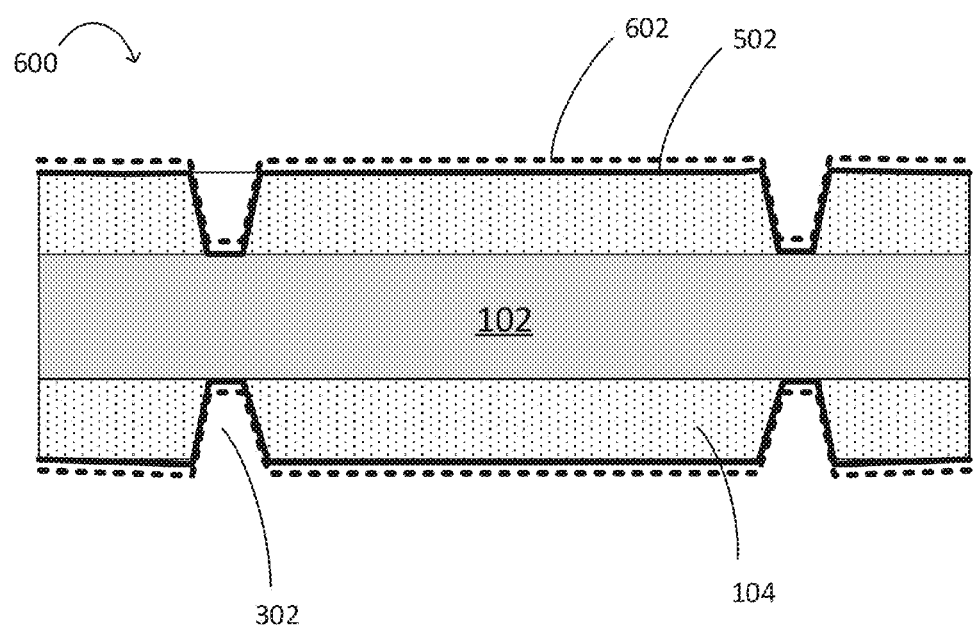

FIG. 6 illustrates assembly 600, which is assembly 500 after a first conductive material layer 602 is deposited. Conductive material layer 602 may be any type of conductive metal, including copper, nickel, or silver, preferably, copper, and may be deposited using any suitable process, including lithography or electroless plating, preferably, electroless plating.

In general, an electrodeposition process comprises the deposition of a metal onto a substrate from an electrolytic solution that comprises ions of the metal to be deposited. A negative bias is placed on the substrate. The electrolyte solution can be referred to as a plating bath or an electroplating bath. The positive ions of the metal are attracted to the negatively biased substrate. The negatively biased substrate reduces the ions and the metal deposits onto the substrate.

Figure 7:
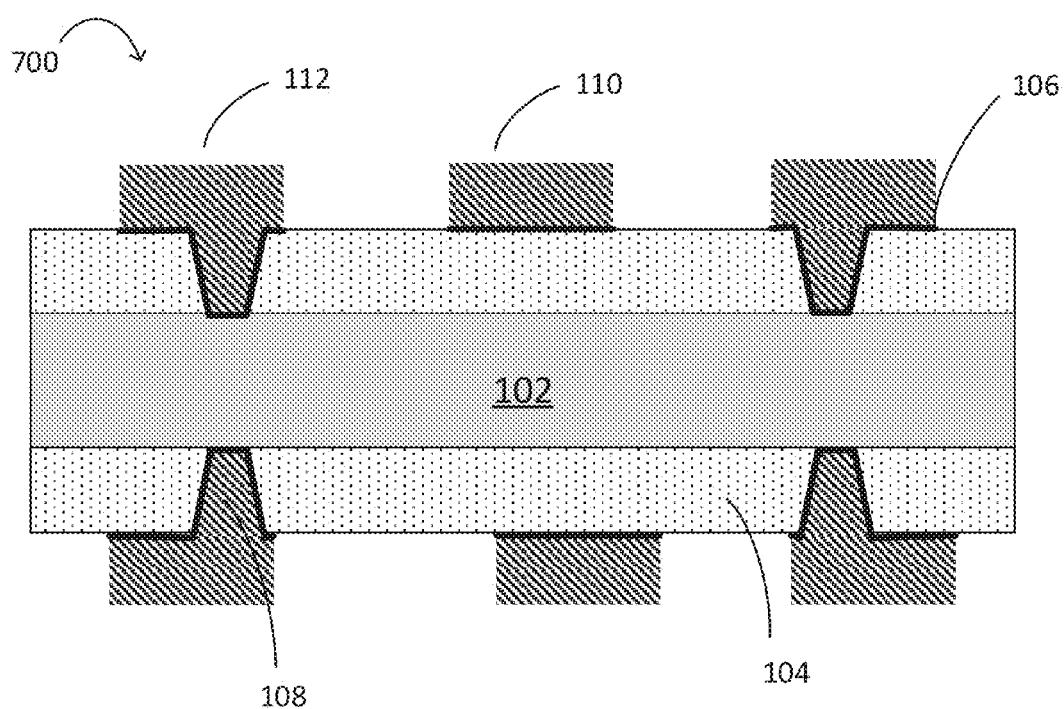

FIG. 7 illustrates assembly 700, which is assembly 600 after patterning of photoresist layer, depositing conductive material, removing the photoresist, and etching the exposed first conductive material layer 602 and underlying adhesive layer. Adhesive layer 106 remains between dielectric layer 104 and conductive features 108, 110, 112.

Conductive vias 108, lines 110, and pads 112 may be formed using any suitable method, including lithography and/or electroless plating, and may include one or more layers. Conductive vias 108 and lines 110 may be formed from any suitable conductive material, for example, copper, aluminum (Al), gold (Au), silver (Ag) and/or alloys thereof. In some embodiments of the invention, the metal used for interconnects is copper or an alloy of copper. Preferably, conductive interconnects are copper (Cu). The conductive (or metal) layer may have an average thickness of between 20 nm and 20 um, or may be of any suitable thickness.

For one embodiment, the patterning of photoresist layer may be implemented with lithographic patterning processes (e.g., exposed with a radiation source through a routing layer mask and developed with a developer) to pattern traces and pads. As illustrated, conductive material is deposited into openings formed by the patterned photoresist layer to form conductive traces 110, and pads 112. In some embodiments, conductive material is deposited using an elytic copper plating. In some embodiments, conductive lines, and pads may be formed with a copper electroplating process, sputtered copper, or the like. Conductive material may be deposited only on the portions of the exposed conductive layer. Conductive vias or pillars may be formed from copper and may act as vertical interconnects between adjacent conductive layers. In some embodiments, portions of exposed conductive layer and underlying adhesive layer may be recessed with a flash etching process, a wet etch or a dry etch process.

If conductive interconnects are formed using lithography, photoresist layers may be deposited using any suitable process, such as lamination, and may be positively or negatively charged to create crosslinked and non-crosslinked portions using ultraviolet for patterning conductive material layer. Non-crosslinked portions dissolve to form openings where conductive material may be deposited.

Additional dielectric layers, adhesive layers, and conductive material layers, including vias, may be added by repeating the process as described in FIGS. 2-7. In some embodiments, a dielectric layer is deposited on top of the conductive features, and the top surface of the conductive via is subsequently revealed by a mechanical, chemical, or plasma etchback.

Figure 8:
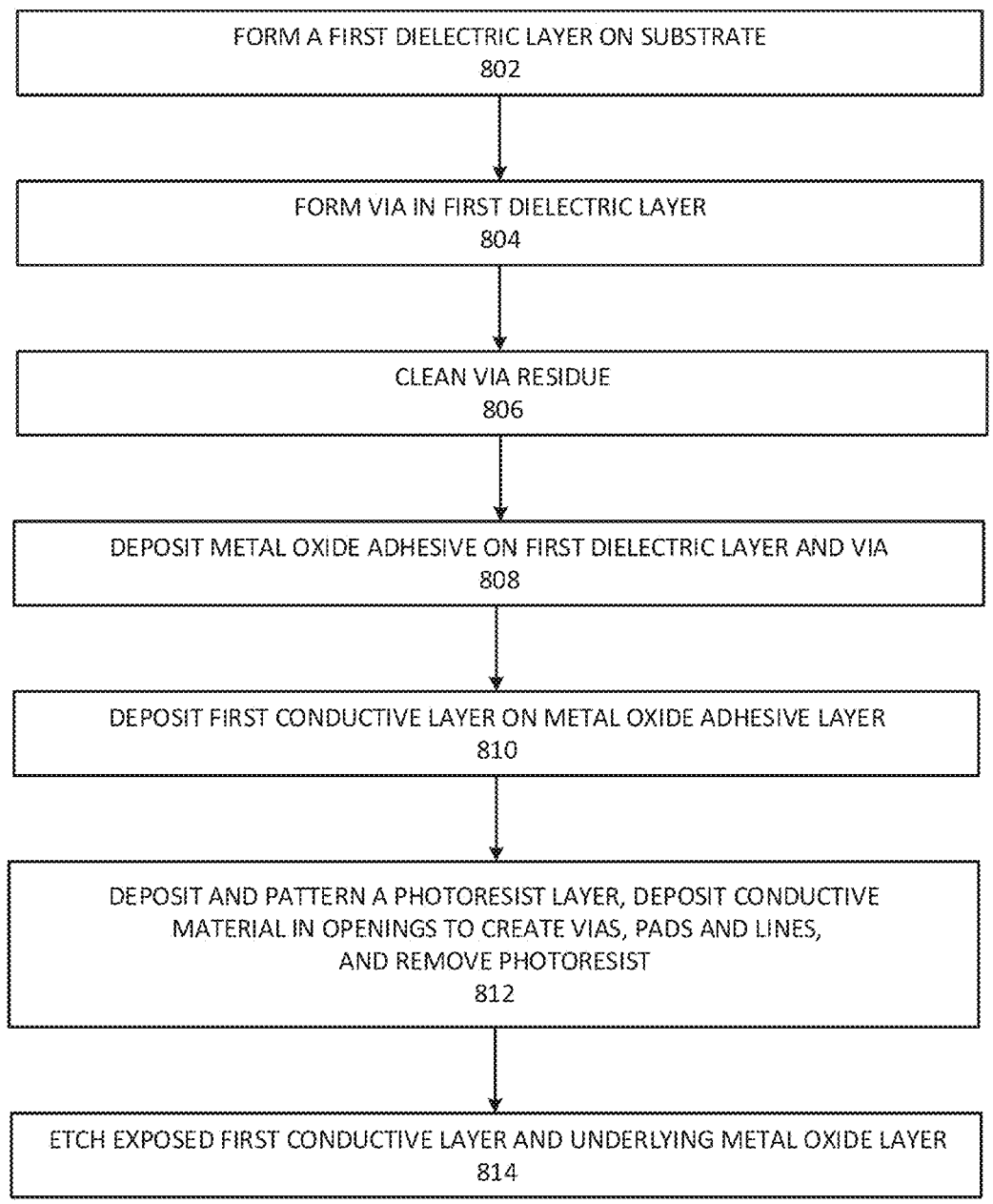
FIG. 8 is a process flow diagram of an example method of forming an integrated circuit substrate having a metal oxide adhesive layer, in accordance with various embodiments.

FIG. 8 is a process flow diagram of an example method of forming an integrated circuit substrate having a metal oxide adhesive layer, in accordance with various embodiments.

At 802, a first dielectric layer may be formed on a substrate. At 804, vias may be formed in the first dielectric layer. At 806, residue in vias may be cleaned. At 808, a metal oxide adhesive layer may be deposited on first dielectric layer and via surfaces. At 810. a first conductive layer may be deposited on the metal oxide adhesive layer. At 812, a first photoresist layer may be deposited and patterned to expose a portion of the first conductive layer, a conductive material may be deposited on the exposed portion of the first photo resist layer to form a patterned conductive layer, and the first photoresist layer may be removed. At 814, portions of the exposed first conductive layer and underlying adhesive layer may be etched.

Additional dielectric layers, metal oxide adhesive layers, and conductive layers may be formed by repeating the process as described in 802 through 814.

An example method of forming a package substrate according to an embodiment is to hard press dielectric on a copper foil coated pre-preg carrier, such as, copper clad laminate, and then cure the dielectric using dry heat. After curing the dielectric layer, laser drill the dielectric material to form vias and to expose the copper on the carrier. Use a wet desmear process to clean away any dielectric residue created by the laser drilling. After the wet desmear process, submerge the carrier with the laser cut dielectric in a sol gel based metal oxide dip coating and then dry using dry heat, ultraviolet light, or other suitable method to remove the solvent. After drying, plate the surface with electroless copper and continue with the semi-additive process (SAP), which is known in the art, to add a patterned conductive layer. Additional dielectric layers, metal oxide adhesive layers, and conductive layers may be added by depositing another dielectric layer on the conductive layer rather than on a substrate and repeating the process.

A die may be coupled to the package substrate via first level interconnects (FLI). The package substrate may be coupled to a circuit board via second level interconnects (SLI). The package substrate may include electrical pathways to route signals or power between the FLI and the SLI, as known in the art.

FIGS. 9A-B are top views of a wafer 900 and dies 902 that may take the form of any of the embodiments of the IC structures 100 disclosed herein. The wafer 900 may be composed of semiconductor material and may include one or more dies 902 having IC elements formed on a surface of the wafer 900. Each of the dies 902 may be a repeating unit of a semiconductor product that includes any suitable IC. After the fabrication of the semiconductor product is complete, the wafer 900 may undergo a singulation process in which each of the dies 902 is separated from one another to provide discrete "chips" of the semiconductor product. The die 902 may include one or more transistors (e.g., some of the transistors 1040 of FIG. 10, discussed below) and/or supporting circuitry to route electrical signals to the transistors, as well as any other IC components. The die 902 may include one or more conductive pathways. In some embodiments, the wafer 900 or the die 902 may include a memory device (e.g., a static random access memory (SRAM) device), a logic device (e.g., an AND, OR, NAND, or NOR gate), or any other suitable circuit element. Multiple ones of these devices may be combined on a single die 902. For example, a memory array formed by multiple memory devices may be formed on a same die 902 as a processing device (e.g., the processing device 1202 of FIG. 12) or other logic that is configured to store information in the memory devices or execute instructions stored in the memory array.

FIG. 10 is a cross-sectional side view of an IC device 1000 that may be used with any of the embodiments of the IC structures disclosed herein. The IC device 1000 may be formed on a substrate 1002 (e.g., the wafer 900 of FIG. 9A) and may be included in a die (e.g., the die 902 of FIG. 9B). In some embodiments, the substrate 1002 may provide the IC substrate 102. The substrate 1002 may be a semiconductor substrate composed of semiconductor material systems including, for example, N-type or P-type materials systems. The substrate 1002 may include, for example, a crystalline substrate formed using a bulk silicon or a silicon-on-insulator substructure. In some embodiments, the substrate 1002 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1002. Although a few examples of materials from which the substrate 1002 may be formed are described here, any material that may serve as a foundation for an IC device 1000 may be used. The substrate 1002 may be part of a singulated die (e.g., the dies 902 of FIG. 9B) or a wafer (e.g., the wafer 900 of FIG. 9A).

The IC device 1000 may include one or more device layers 1004 disposed on the substrate 1002. The device layer 1004 may be included in the circuitry at the device side of the die of the IC structures disclosed herein. The device layer 1004 may include features of one or more transistors 1040 (e.g., metal oxide semiconductor field-effect transistors (MOSFETs)) formed on the substrate 1002. The device layer 1004 may include, for example, one or more source and/or drain (S/D) regions 1020, a gate 1022 to control current flow in the transistors 1040 between the S/D regions 1020, and one or more S/D contacts 1024 to route electrical signals to/from the S/D regions 1020. The transistors 1040 may include additional features not depicted for the sake of clarity, such as device isolation regions, gate contacts, and the like. The transistors 1040 are not limited to the type and configuration depicted in FIG. 10 and may include a wide variety of other types and configurations such as, for example, planar transistors, nonplanar transistors, or a combination of both. Nonplanar transistors may include FinFET transistors, such as double-gate transistors or tri-gate transistors, and wraparound or all-around gate transistors, such as nanoribbon and nanowire transistors.

Each transistor 1040 may include a gate 1022 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 1040 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 1040 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1020 may be formed within the substrate 1002 adjacent to the gate 1022 of each transistor 1040. The S/D regions 1020 may be formed using either an implantation/diffusion process or an etching/deposition process, for example. In the former process, dopants such as boron, aluminum, antimony, phosphorous, or arsenic may be ion-implanted into the substrate 1002 to form the S/D regions 1020. An annealing process that activates the dopants and causes them to diffuse farther into the substrate 1002 may follow the ion-implantation process. In the latter process, the substrate 1002 may first be etched to form recesses at the locations of the S/D regions 1020. An epitaxial deposition process may then be carried out to fill the recesses with material that is used to fabricate the S/D regions 1020. In some implementations, the S/D regions 1020 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1020 may be formed using one or more alternate semiconductor materials such as germanium or a group III-V material or alloy. In further embodiments, one or more layers of metal and/or metal alloys may be used to form the S/D regions 1020.

Electrical signals, such as power and/or input/output (I/O) signals, may be routed to and/or from the transistors 1040 of the device layer 1004 through one or more interconnect layers disposed on the device layer 1004 (illustrated in FIG. 10 as interconnect layers 1006-1010), which may be any of the embodiments of the IC structures disclosed herein. For example, electrically conductive features of the device layer 1004 (e.g., the gate 1022 and the S/D contacts 1024) may be electrically coupled with the interconnect structures 1028 of the interconnect layers 1006-1010. The one or more interconnect layers 1006-1010 may form an interlayer dielectric (ILD) stack 1019 of the IC device 1000. The conductive pathways 1012 may extend to, and electrically couple to, one or more of the interconnect layers 1006-1010. The conductive pathways may route signals to/from the devices in the device layer 1004, or may route signals through the interconnect layers 1006-1010 to/from other devices (e.g., other electronic components in a stacked IC structure, or other components sharing a circuit board with the IC device 1000).

The interconnect structures 1028 may be arranged within the interconnect layers 1006-1010 to route electrical signals according to a wide variety of designs (in particular, the arrangement is not limited to the particular configuration of interconnect structures 1028 depicted in FIG. 10). Although a particular number of interconnect layers 1006-1010 is depicted in FIG. 10, embodiments of the present disclosure include IC devices having more or fewer interconnect layers than depicted.

In some embodiments, the interconnect structures 1028 may include trench structures 1028a (sometimes referred to as "lines") and/or via structures 1028b (sometimes referred to as "holes") filled with an electrically conductive material such as a metal. The trench structures 1028a may be arranged to route electrical signals in a direction of a plane that is substantially parallel with a surface of the substrate 1002 upon which the device layer 1004 is formed. For example, the trench structures 1028a may route electrical signals in a direction in and out of the page from the perspective of FIG. 10. The via structures 1028b may be arranged to route electrical signals in a direction of a plane that is substantially perpendicular to the surface of the substrate 1002 upon which the device layer 1004 is formed. In some embodiments, the via structures 1028b may electrically couple trench structures 1028a of different interconnect layers 1006-1010 together.

The interconnect layers 1006-1010 may include a dielectric material 1026 disposed between the interconnect structures 1028, as shown in FIG. 10. In some embodiments, the dielectric material 1026 disposed between the interconnect structures 1028 in different ones of the interconnect layers 1006-1010 may have different compositions; in other embodiments, the composition of the dielectric material 1026 between different interconnect layers 1006-1010 may be the same.

A first interconnect layer 1006 (referred to as Metal 1 or "M1") may be formed directly on the device layer 1004. In some embodiments, the first interconnect layer 1006 may include trench structures 1028a and/or via structures 1028b, as shown. The trench structures 1028a of the first interconnect layer 1006 may be coupled with contacts (e.g., the S/D contacts 1024) of the device layer 1004.

A second interconnect layer 1008 (referred to as Metal 2 or "M2") may be formed directly on the first interconnect layer 1006. In some embodiments, the second interconnect layer 1008 may include via structures 1028b to couple the trench structures 1028a of the second interconnect layer 1008 with the trench structures 1028a of the first interconnect layer 1006. Although the trench structures 1028a and the via structures 1028b are structurally delineated with a line within each interconnect layer (e.g., within the second interconnect layer 1008) for the sake of clarity, the trench structures 1028a and the via structures 1028b may be structurally and/or materially contiguous (e.g., simultaneously filled during a dual-damascene process) in some embodiments.

A third interconnect layer 1010 (referred to as Metal 3 or "M3") (and additional interconnect layers, as desired) may be formed in succession on the second interconnect layer 1008 according to similar techniques and configurations described in connection with the second interconnect layer 1008 or the first interconnect layer 1006.

The IC device 1000 may include a solder resist material 1034 (e.g., polyimide or similar material) and one or more bond pads 1036 formed on the interconnect layers 1006-1010. The bond pads 1036 may provide the contacts to couple to the FLI, for example. The bond pads 1036 may be electrically coupled with the interconnect structures 1028 and configured to route the electrical signals of the transistor(s) 1040 to other external devices. For example, solder bonds may be formed on the one or more bond pads 1036 to mechanically and/or electrically couple a chip including the IC device 1000 with another component (e.g., a circuit board). The IC device 1000 may have other alternative configurations to route the electrical signals from the interconnect layers 1006-1010 than depicted in other embodiments. For example, the bond pads 1036 may be replaced by or may further include other analogous features (e.g., posts) that route the electrical signals to external components.

Figure 11:
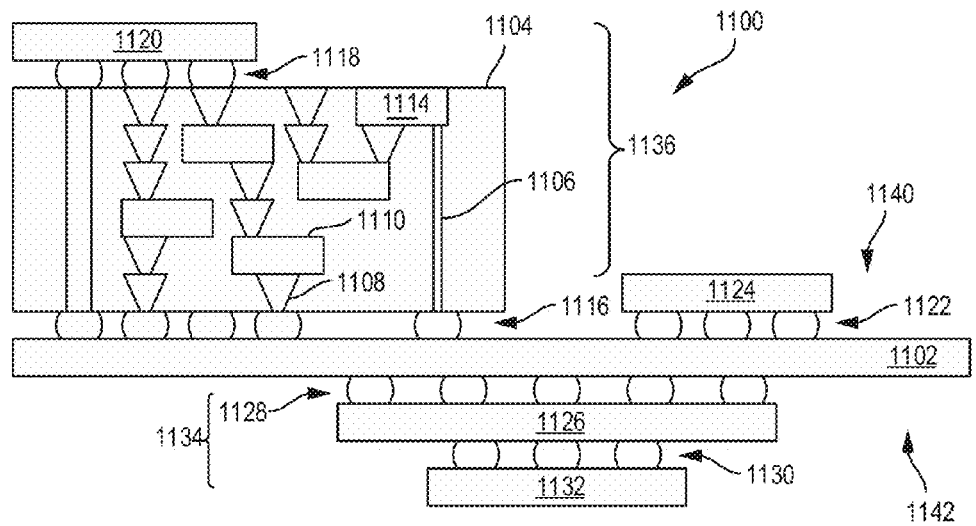
FIG. 11 is a cross-sectional side view of an IC device assembly that may include any of the embodiments of the packages disclosed herein.

FIG. 11 is a cross-sectional side view of an IC device assembly 1100 that may include any of the embodiments of the IC structures disclosed herein. The IC device assembly 1100 includes a number of components disposed on a circuit board 1102 (which may be, e.g., a motherboard). The IC device assembly 1100 includes components disposed on a first face 1140 of the circuit board 1102 and an opposing second face 1142 of the circuit board 1102; generally, components may be disposed on one or both faces 1140 and 1142.

In some embodiments, the circuit board 1102 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1102. In other embodiments, the circuit board 1102 may be a non-PCB substrate.

The IC device assembly 1100 illustrated in FIG. 11 includes a package-on-interposer structure 1136 coupled to the first face 1140 of the circuit board 1102 by coupling components 1116. The coupling components 1116 may electrically and mechanically couple the package-on-interposer structure 1136 to the circuit board 1102, and may include solder balls (as shown in FIG. 11), male and female portions of a socket, an adhesive, an underfill material, and/or any other suitable electrical and/or mechanical coupling structure.

The package-on-interposer structure 1136 may include an electronics package 1120 coupled to an interposer 1104 by coupling components 1118. The coupling components 1118 may take any suitable form for the application, such as the forms discussed above with reference to the coupling components 1116. Although a single electronics package 1120 is shown in FIG. 11, multiple electronics packages may be coupled to the interposer 1104; indeed, additional interposers may be coupled to the interposer 1104. The interposer 1104 may provide an intervening substrate used to bridge the circuit board 1102 and the electronics package 1120. The electronics package 1120 may be or include, for example, a die (the die 902 of FIG. 9B), an IC device (e.g., the IC device 1000 of FIG. 10), or any other suitable component. Generally, the interposer 1104 may spread a connection to a wider pitch or reroute a connection to a different connection. For example, the interposer 1104 may couple the electronics package 1120 (e.g., a die) to a ball grid array (BGA) of the coupling components 1116 for coupling to the circuit board 1102. In the embodiment illustrated in FIG. 11, the electronics package 1120 and the circuit board 1102 are attached to opposing sides of the interposer 1104; in other embodiments, the electronics package 1120 and the circuit board 1102 may be attached to a same side of the interposer 1104. In some embodiments, three or more components may be interconnected by way of the interposer 1104. In some embodiments, the electronics package 1120 may include an IC structure disclosed herein. An additional electronic component may be disposed on the electronics package 1120 to form a stacked IC structure.

The interposer 1104 may be formed of an epoxy resin, a fiberglass-reinforced epoxy resin, a ceramic material, or a polymer material such as polyimide. In some embodiments, the interposer 1104 may be formed of alternate rigid or flexible materials that may include the same materials described above for use in a semiconductor substrate, such as silicon, germanium, and other group III-V and group IV materials. The interposer 1104 may include metal interconnects 1108 and vias 1110, including but not limited to through-silicon vias (TSVs) 1106. The interposer 1104 may further include embedded devices 1114, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 1104. The package-on-interposer structure 1136 may take the form of any of the package-on-interposer structures known in the art.

The IC device assembly 1100 may include an electronics package 1124 coupled to the first face 1140 of the circuit board 1102 by coupling components 1122. The coupling components 1122 may take the form of any of the embodiments discussed above with reference to the coupling components 1116, and the electronics package 1124 may take the form of any of the embodiments discussed above with reference to the electronics package 1120. In some embodiments, the electronics package 1124 may include any IC structure disclosed herein. An additional electronic component may be disposed on the electronics package 1124 to form a stacked IC structure.

The IC device assembly 1100 illustrated in FIG. 11 includes a package-on-package structure 1134 coupled to the second face 1142 of the circuit board 1102 by coupling components 1128. The package-on-package structure 1134 may include an electronics package 1126 and an electronics package 1132 coupled together by coupling components 1130 such that the electronics package 1126 is disposed between the circuit board 1102 and the electronics package 1132. The package-on-package structure 1134 may take the form of an IC structure disclosed herein. The coupling components 1128 and 1130 may take the form of any of the embodiments of the coupling components 1116 discussed above, and the electronics packages 1126 and 1132 may take the form of any of the embodiments of the electronics package 1120 discussed above.

Figure 12:
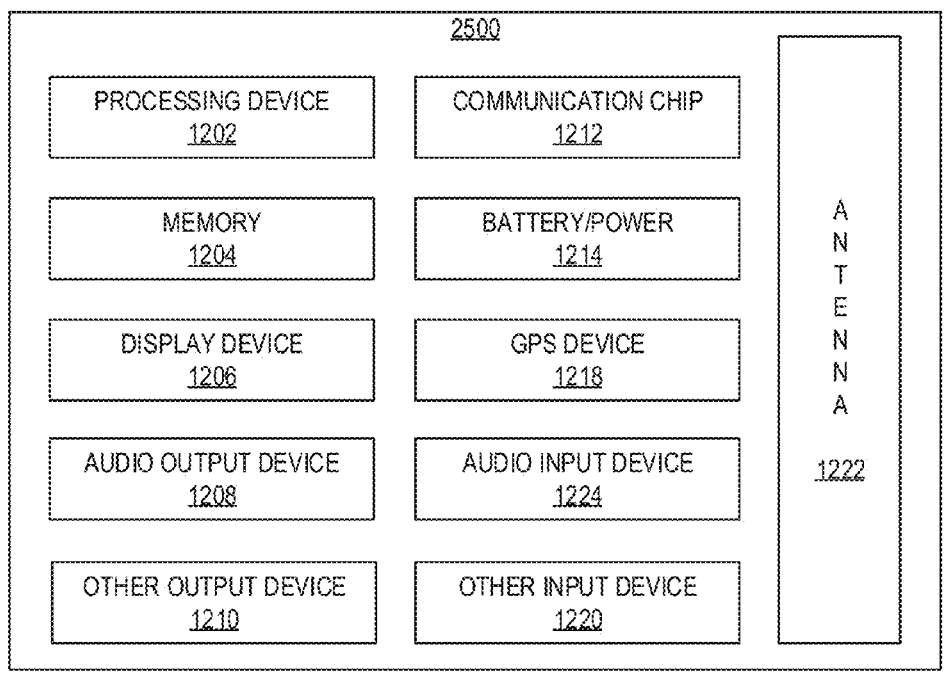
FIG. 12 is a block diagram of an example computing device that may include any of the embodiments of the packages disclosed herein.

FIG. 12 is a block diagram of an example computing device 1200 that may include one or more of any of the embodiments of the IC structures disclosed herein. A number of components are illustrated in FIG. 12 as included in the computing device 1200, but any one or more of these components may be omitted or duplicated, as suitable for the application. In some embodiments, some or all of the components included in the computing device 1200 may be attached to one or more motherboards. In some embodiments, some or all of these components are fabricated onto a single system-on-a-chip (SoC) die.

Additionally, in various embodiments, the computing device 1200 may not include one or more of the components illustrated in FIG. 12, but the computing device 1200 may include interface circuitry for coupling to the one or more components. For example, the computing device 1200 may not include a display device 1206, but may include display device interface circuitry (e.g., a connector and driver circuitry) to which a display device 1206 may be coupled. In another set of examples, the computing device 1200 may not include an audio input device 1224 or an audio output device 1208, but may include audio input or output device interface circuitry (e.g., connectors and supporting circuitry) to which an audio input device 1224 or audio output device 1208 may be coupled.

The computing device 1200 may include a processing device 1202 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1202 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1200 may include a memory 1204, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1204 may include memory that shares a die with the processing device 1202. This memory may be used as cache memory and may include embedded dynamic random access memory (eDRAM) or spin transfer torque magnetic random-access memory (STT-MRAM).

In some embodiments, the computing device 1200 may include a communication chip 1212 (e.g., one or more communication chips). For example, the communication chip 1212 may be configured for managing wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1212 may implement any of a number of wireless standards or protocols, including but not limited to Institute for Electrical and Electronic Engineers (IEEE) standards including Wi-Fi (IEEE 2302.11 family), IEEE 2302.16 standards (e.g., IEEE 2302.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 2302.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 2302.16 standards. The communication chip 1212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1212 may operate in accordance with other wireless protocols in other embodiments. The computing device 1200 may include an antenna 1222 to facilitate wireless communications and/or to receive other wireless communications (such as AM or FM radio transmissions).

In some embodiments, the communication chip 1212 may manage wired communications, such as electrical, optical, or any other suitable communication protocols (e.g., the Ethernet). As noted above, the communication chip 1212 may include multiple communication chips. For instance, a first communication chip 1212 may be dedicated to shorter-range wireless communications such as Wi-Fi or Bluetooth, and a second communication chip 1212 may be dedicated to longer-range wireless communications such as GPS, EDGE, GPRS, CDMA, WiMAX, LTE, EV-DO, or others. In some embodiments, a first communication chip 1212 may be dedicated to wireless communications, and a second communication chip 1212 may be dedicated to wired communications.

The computing device 1200 may include battery/power circuitry 1214. The battery/power circuitry 1214 may include one or more energy storage devices (e.g., batteries or capacitors) and/or circuitry for coupling components of the computing device 1200 to an energy source separate from the computing device 1200 (e.g., AC line power).

The computing device 1200 may include a display device 1206 (or corresponding interface circuitry, as discussed above). The display device 1206 may include any visual indicators, such as a heads-up display, a computer monitor, a projector, a touchscreen display, a liquid crystal display (LCD), a light-emitting diode display, or a flat panel display, for example.

The computing device 1200 may include an audio output device 1208 (or corresponding interface circuitry, as discussed above). The audio output device 1208 may include any device that generates an audible indicator, such as speakers, headsets, or earbuds, for example.

The computing device 1200 may include an audio input device 1224 (or corresponding interface circuitry, as discussed above). The audio input device 1224 may include any device that generates a signal representative of a sound, such as microphones, microphone arrays, or digital instruments (e.g., instruments having a musical instrument digital interface (MIDI) output).

The computing device 1200 may include a global positioning system (GPS) device 1218 (or corresponding interface circuitry, as discussed above). The GPS device 1218 may be in communication with a satellite-based system and may receive a location of the computing device 1200, as known in the art.

The computing device 1200 may include an other output device 1210 (or corresponding interface circuitry, as discussed above). Examples of the other output device 1210 may include an audio codec, a video codec, a printer, a wired or wireless transmitter for providing information to other devices, or an additional storage device.

The computing device 1200 may include an other input device 1220 (or corresponding interface circuitry, as discussed above). Examples of the other input device 1220 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1200 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1200 may be any other electronic device that processes data.

Some Examples in accordance with various embodiments of the present disclosure are now described.

Example 1 is an integrated circuit interconnect structure including: a dielectric layer, wherein the dielectric layer comprises 60% or more filler; a conductive layer; and a metal oxide adhesive layer, wherein the metal oxide adhesive layer is between the dielectric layer and the conductive layer.

Example 2 may include the subject matter of Example 1, and may further specify that the metal oxide adhesive layer comprises one or more of aluminum oxide, chromium oxide, and nickel oxide.

Example 3 may include the subject matter of any of Examples 1-2, and may further specify that a thickness of the metal oxide adhesive layer is between 4 nanometers and 40 nanometers.

Example 4 may include the subject matter of any of Examples 1-3, and may further specify that the dielectric layer material comprises between 65% and 75% filler.

Example 5 may include the subject matter of any of Examples 1-4, and may further specify that the dielectric layer filler material comprises silica.

Example 6 may include the subject matter of Example 5, and may further specify that the silica filler material comprises silica treated with a silane coupling agent.

Example 7 may include the subject matter of any of Examples 1-6, and may further specify that the dielectric layer comprises one or more of epoxy and resin.

Example 8 may include the subject matter of any of Examples 1-7, and may further specify that the conductive layer comprises one or more layers, and wherein one of the one or more layers is an electroless copper seed layer.

Example 9 may include the subject matter of any of Examples 1-8, and may further include a via, wherein the metal oxide adhesive layer is formed within the via.

Example 10 is a method of manufacturing an integrated circuit interconnect structure, including: forming a first dielectric layer on a substrate; forming a via in the first dielectric layer; cleaning via formation residue from the via; depositing a first metal oxide adhesive layer on the first dielectric layer including the via; depositing a first conductive layer on the metal oxide adhesive layer; patterning and depositing a second conductive layer on the first conductive layer; and etching the exposed first conductive layer and the underlying first metal oxide adhesive layer.

Example 11 may include the subject matter of Example 10, and may further specify that the substrate is a copper clad laminate.

Example 12 may include the subject matter of any of Examples 10-11, and may further specify that the via is formed by laser drilling.

Example 13 may include the subject matter of any of Examples 10-12, and may further specify that the metal oxide adhesive layer is deposited by sol gel based metal oxide dip coating.

Example 14 may include the subject matter of Example 13, and may further specify that depositing the metal oxide adhesive layer further comprises annealing at a temperature at or below 200 degrees Celsius.

Example 15 may include the subject matter of any of Examples 10-14, and may further specify that the metal oxide adhesive layer comprises one or more of aluminum oxide, chromium oxide, and nickel oxide.

Example 16 may include the subject matter of any of Examples 10-15, and may further specify that the first conductive layer comprises copper deposited by electroless plating.

Example 17 may include the subject matter of any of Examples 10-16, and may further specify that the via formation residue is cleaned by a wet desmear process.

Example 18 may include the subject matter of any of Examples 10-17, and may further specify that the first conductive layer and the underlying first metal oxide adhesive layer are etched by a chemical etch.

Example 19 may include the subject matter of Example 10, and may further include: forming a second dielectric layer on the first dielectric layer and the second conductive layer; forming a via in the second dielectric layer; cleaning via formation residue from the via; depositing a second metal oxide adhesive layer on the second dielectric layer including the via; depositing a third conductive layer on the metal oxide adhesive layer; patterning and depositing a fourth conductive layer on the third conductive layer; and etching the exposed third conductive layer and the underlying second metal oxide adhesive layer.

Example 20 is an integrated circuit package including: a die; first level interconnects; second level interconnects; and a package substrate including: a dielectric layer, wherein the dielectric layer comprises 60% or more filler; a conductive layer; and a metal oxide adhesive layer, wherein the metal oxide adhesive layer is between the dielectric layer and the conductive layer.

Example 21 may include the subject matter of Example 20, and may further specify that the metal oxide adhesive layer comprises one or more of aluminum oxide, chromium oxide, and nickel oxide.

Example 22 may include the subject matter of any of Examples 20-21, and may further specify that a thickness of the metal oxide adhesive layer is between 4 nanometers and 40 nanometers.

Example 23 may include the subject matter of any of Examples 20-22, and may further specify that the dielectric layer material comprises between 65% and 75% filler.

Example 24 may include the subject matter of any of Examples 20-23, and may further specify that the dielectric layer filler material comprises silica.

Example 25 may include the subject matter of Example 24, and may further specify that the silica filler material comprises silica treated with a silane coupling agent.

Example 26 may include the subject matter of any of Examples 20-25, and may further specify that the conductive layer comprises one or more layers, and wherein one of the one or more layers is an electroless copper seed layer.

Example 27 is a computing device, including: a circuit board; and an IC package coupled to the circuit board, wherein the IC package includes: a die; first level interconnects; second level interconnects; and a package substrate including: a dielectric layer, wherein the dielectric layer comprises 60% or more filler; a conductive layer; and a metal oxide adhesive layer, wherein the metal oxide adhesive layer is between the dielectric layer and the conductive layer.

Example 28 may include the subject matter of Example 27, and may further specify that the metal oxide adhesive layer comprises one or more of aluminum oxide, chromium oxide, and nickel oxide.

Example 29 may include the subject matter of any of Examples 27-28, and may further specify that a thickness of the metal oxide adhesive layer is between 4 nanometers and 40 nanometers.

Example 30 may include the subject matter of any of Examples 27-29, and may further specify that the dielectric layer material comprises between 65% and 75% filler.

Example 31 may include the subject matter of any of Examples 27-30, and may further specify that the dielectric layer filler material comprises silica.

Example 32 may include the subject matter of Example 31, and may further specify that the silica filler material comprises silica treated with a silane coupling agent.

Example 33 may include the subject matter of any of Examples 27-32, and may further specify that the conductive layer comprises one or more layers, and wherein one of the one or more layers is an electroless copper seed layer.

The invention claimed is:

1. A method of manufacturing an integrated circuit interconnect structure, comprising:
    forming a first dielectric layer on a substrate, wherein the first dielectric layer comprises 60% or more filler;
    forming a via in the first dielectric layer;
    cleaning via formation residue from the via;
    depositing a first metal oxide adhesive layer on the first dielectric layer including the via;
    depositing a first conductive layer on the first metal oxide adhesive layer, wherein the first metal oxide adhesive layer is in contact with the first dielectric layer and the first conductive layer;
    patterning and depositing a second conductive layer on the first conductive layer, wherein the patterning of the second conductive layer exposes areas of the first conductive layer; and
    etching the exposed areas of the first conductive layer and the corresponding underlying areas of the first metal oxide adhesive layer.

2. The method of claim 1, wherein the substrate is a copper clad laminate.

3. The method of claim 1, wherein the first metal oxide adhesive layer is deposited by sol gel based metal oxide dip coating.

4. The method of claim 3, wherein depositing the first metal oxide adhesive layer further comprises annealing at a temperature at or below 200 degrees Celsius.

5. The method of claim 1, wherein the first metal oxide adhesive layer comprises one or more of aluminum oxide, chromium oxide, and nickel oxide.

6. The method of claim 1, wherein the first conductive layer comprises copper deposited by electroless plating.

7. The method of claim 1, further comprising:
forming a second dielectric layer on the first dielectric layer and the second conductive layer;
forming a via in the second dielectric layer;
cleaning via formation residue from the via;
depositing a second metal oxide adhesive layer on the second dielectric layer including the via;
depositing a third conductive layer on the second metal oxide adhesive layer, wherein the second metal oxide adhesive layer is in contact with the second dielectric layer and the third conductive layer;
patterning and depositing a fourth conductive layer on the third conductive layer, wherein the patterning of the fourth conductive layer exposes areas of the third conductive layer; and
etching the exposed areas of the third conductive layer and the corresponding underlying areas of the second metal oxide adhesive layer.

8. An integrated circuit package comprising:
a die;
first level interconnects;
second level interconnects; and
a package substrate comprising:
a dielectric layer, wherein the dielectric layer comprises 60% or more filler;
a conductive layer; and
a metal oxide adhesive layer, wherein a thickness of the metal oxide adhesive layer is between 15 nanometers and 40 nanometers, and wherein the metal oxide adhesive layer is in contact with the dielectric layer and the conductive layer.

9. The integrated circuit package of claim 8, wherein the metal oxide adhesive layer comprises one or more of aluminum oxide, chromium oxide, and nickel oxide.

10. The integrated circuit package of claim 8, wherein the dielectric layer comprises between 65% and 75% filler.

11. The integrated circuit package of claim 8, wherein the filler comprises silica.

12. The integrated circuit package of claim 8, wherein the conductive layer comprises one or more layers, and wherein one of the one or more layers is an electroless copper seed layer.

13. A computing device, comprising:
a circuit board; and
an integrated circuit package coupled to the circuit board, wherein the integrated circuit package comprises:
a die;
first level interconnects;
second level interconnects; and
a package substrate comprising:
a dielectric layer, wherein the dielectric layer comprises 60% or more filler;
a conductive layer; and
a metal oxide adhesive layer, wherein a thickness of the metal oxide adhesive layer is between 15 nanometers and 40 nanometers, and wherein the metal oxide adhesive layer is in contact with the dielectric layer and the conductive layer.

14. The computing device of claim 13, wherein the metal oxide adhesive layer comprises one or more of aluminum oxide, chromium oxide, and nickel oxide.

15. The computing device of claim 13, wherein the dielectric layer comprises between 65% and 75% filler.

16. The computing device of claim 13, wherein the filler comprises silica.

17. The computing device of claim 13, wherein the conductive layer comprises one or more layers, and wherein one of the one or more layers is an electroless copper seed layer.

18. The method of claim 1, wherein the first metal oxide adhesive layer comprises oxygen and one or more of aluminum, chromium, and nickel.

19. The integrated circuit package of claim 8, wherein the metal oxide adhesive layer comprises oxygen and one or more of aluminum, chromium, and nickel.

20. The computing device of claim 13, wherein the metal oxide adhesive layer comprises oxygen and one or more of aluminum, chromium, and nickel.

* * * * *